(12) United States Patent
Han

(10) Patent No.: US 11,600,674 B2
(45) Date of Patent: Mar. 7, 2023

(54) METHOD FOR MANUFACTURING PIXEL STRUCTURE AND DISPLAY PANEL

(71) Applicant: Shenzhen China Star Optoelectronics Semiconductor Display Technology Co., Ltd., Guangdong (CN)

(72) Inventor: Zhibin Han, Shenzhen (CN)

(73) Assignee: SHENZHEN CHINA STAR OPTOELECTRONICS SEMICONDUCTOR DISPLAY TECHNOLOGY CO., LTD.

( * ) Notice: Subject to any disclaimer, the term of this patent is extended or adjusted under 35 U.S.C. 154(b) by 213 days.

(21) Appl. No.: 16/761,856

(22) PCT Filed: Mar. 27, 2020

(86) PCT No.: PCT/CN2020/081562
§ 371 (c)(1),
(2) Date: May 6, 2020

(87) PCT Pub. No.: WO2021/168964
PCT Pub. Date: Sep. 2, 2021

(65) Prior Publication Data
US 2022/0109034 A1    Apr. 7, 2022

(30) Foreign Application Priority Data

Feb. 27, 2020   (CN) .......................... 202010125895.7

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 51/5209* (2013.01); *H01L 51/56* (2013.01); *H01L 2227/323* (2013.01)

(58) Field of Classification Search
CPC ........... H01L 27/3246; H01L 2227/323; H01L 51/5209; H01L 51/56
(Continued)

(56) References Cited

U.S. PATENT DOCUMENTS

2002/0171781 A1* 11/2002 Kim .................. G02F 1/136259
349/43
2005/0057148 A1* 3/2005 Seki ..................... H01L 27/3211
313/506
(Continued)

FOREIGN PATENT DOCUMENTS

CN       1747614 A      3/2006
CN       101241280 A    8/2008
(Continued)

*Primary Examiner* — Dzung Tran
(74) *Attorney, Agent, or Firm* — Luedeka Neely Group, PC

(57) ABSTRACT

The present application provides a method for manufacturing a pixel structure and a display panel. The pixel structure includes a substrate, a plurality of first pixel banks, and a plurality of second pixel banks. The first pixel banks intersect a long side direction of the substrate. The second pixel banks are parallel to the long side direction of the substrate. Light emitting materials with a same color are disposed between two adjacent second pixel banks, so that this pixel design can be compatible with MMG line-bank printing, which alleviates a problem that existing MMG pixel arrangement mode restricts a printing mode.

12 Claims, 6 Drawing Sheets

(58) Field of Classification Search
USPC .......................................................... 257/91
See application file for complete search history.

(56) References Cited

U.S. PATENT DOCUMENTS

| | | | |
|---|---|---|---|
| 2006/0061700 A1* | 3/2006 | Chung | G02F 1/136213 349/38 |
| 2009/0322978 A1* | 12/2009 | Peng | G02F 1/136259 349/139 |
| 2011/0241027 A1* | 10/2011 | Kaneta | H01L 27/3246 438/22 |
| 2017/0309691 A1* | 10/2017 | Madigan | H01L 27/3276 |
| 2018/0138459 A1 | 5/2018 | Takata | |
| 2019/0088683 A1* | 3/2019 | An | G02F 1/136259 |

FOREIGN PATENT DOCUMENTS

| | | |
|---|---|---|
| CN | 102402943 A | 4/2012 |
| CN | 102960068 A | 3/2013 |
| CN | 110783494 A | 2/2020 |

\* cited by examiner

S10 — manufacturing a substrate comprises: providing a base plate, manufacturing a driving circuit on the base plate, manufacturing a plurality of pixel electrodes on the driving circuit, wherein the pixel electrodes are connected to the driving circuit by a plurality of holes, long side directions of the pixel electrodes are parallel to a long side direction of the substrate;

S20 — manufacturing pixel banks comprises: manufacturing a plurality of first pixel banks on the substrate, manufacturing a plurality of second pixel banks on the substrate, wherein the second pixel banks stride over the first pixel banks, a thickness of the second pixel bank is greater than a thickness of the first pixel bank;

S30 — manufacturing a light emitting layer comprises: coating light emitting materials with the same color between adjacent second pixel banks.

FIG. 12

METHOD FOR MANUFACTURING PIXEL STRUCTURE AND DISPLAY PANEL

BACKGROUND OF INVENTION

Field of Invention

The present application relates to the field of display technology, and particularly to a method for manufacturing a pixel structure and a display panel.

Description of Prior Art

Organic light emitting diode (OLED) displays have gradually become high-level displays replacing liquid crystal displays due to their advantages of ultra-high contrast, wide color gamut, fast response times, active light emission, etc. With sizes of OLED displays and OLED TVs increasing, sizes of glass substrates of their corresponding mass production are also increasing. In order to maximize utilization rate of glass, it is necessary to prepare OLED products with different sizes on a same glass substrate, that is, multi-model group (MMG) technology. A traditional hybrid arrangement of OLED panels and pixel arrangement is shown in FIG. 1. Two OLED panels with two different sizes of 65" and 55" are arranged perpendicular to each other on a same glass substrate 800. The pixel arrangements of the OLED panels are a long side direction of the sub pixel parallel to a short side direction of the panel, wherein long side directions of the sub pixels R/G/B are shown as an arrow direction of FIG. 1, so that the pixel arrangement directions of two OLED panels with different sizes are perpendicular to each other. A common way to print OLED light emitting material is to print a whole strip of sub pixel of a same color in a same bank area, that is, the printing method of line-bank. As shown in FIG. 1, the sub-pixels R/G/B are printed as a whole strip. Therefore, the traditional hybrid arrangement of OLED panels and pixel arrangement will limit the printing method of line-bank. After an OLED panel of one product is printed, the glass substrate is rotated by 90°, and then an OLED panel of another product is printed. This leads to an increase in equipment cost and an increase in production time, and is unfavorable for mass production.

Therefore, it is necessary to solve a problem of printing methods limited by a pixel arrangement of an existing hybrid arrangement OLED panel.

SUMMARY OF INVENTION

The present application provides a method for manufacturing a pixel structure and a display panel to solve a problem of printing methods limited by a pixel arrangement of an existing hybrid arrangement OLED panel.

To solve the above problem, the present application provides technical proposals as follows:

The present application provides a pixel structure, and the pixel structure includes a substrate, a plurality of first pixel banks and a plurality of second pixel banks. The first pixel banks are disposed the substrate and intersect a long side direction of the substrate. The second pixel banks stride over the first pixel banks, are disposed on the substrate, and are parallel to the long side direction of the substrate. Light emitting materials of the same color are disposed between adjacent two of the second pixel banks, and the light emitting materials cover parts of the first pixel banks.

In the pixel structure of the present application, angles between the first pixel banks and the long side direction of the substrate are 45 degrees or 135 degrees.

In the pixel structure of the present application, a thickness of each of the second pixel banks is greater than a thickness of each of the first pixel banks.

In the pixel structure of the present application, the substrate includes driving circuits and a plurality of pixel electrodes disposed on the driving circuits, the pixel electrodes are connected to the driving circuits by a plurality of holes, and the holes are disposed under the first pixel banks.

In the pixel structure of the present application, each of the pixel electrode includes a main electrode disposed in a region limited by the first pixel banks and the second pixel banks and a connecting electrode and a bridge electrode electrically connected to the main electrode and disposed at two diagonal corners of the main electrode, and the connecting electrode are connected to the driving circuit by the hole.

In the pixel structure of the present application, the connecting electrode and the bridge electrode are disposed under the first pixel banks, and the bridge electrode is separated from the connecting electrode of another adjacent pixel electrode disposed in the same row.

In the pixel structure of the present application, a width of each of the connecting electrodes is less than a width of each of the main electrodes.

In the pixel structure of the present application, a width of each of the bridge electrodes is less than a width of each of the main electrodes.

The present application provides a method for manufacturing a pixel structure, the method for manufacturing the pixel structure includes: a step S10 of manufacturing a substrate includes: providing a base plate, manufacturing driving circuits on the base plate, manufacturing a plurality of pixel electrodes on the driving circuits, wherein the pixel electrodes are connected to the driving circuits by a plurality of holes, long side directions of the pixel electrodes are parallel to a long side direction of the substrate; a step S20 of manufacturing pixel banks includes: manufacturing a plurality of first pixel banks on the substrate, manufacturing a plurality of second pixel banks on the substrate, wherein the second pixel banks stride over the first pixel banks, a thickness of each of the second pixel banks is greater than a thickness of each of the first pixel banks; and a step S30 of manufacturing a light emitting layer includes: coating light emitting materials of the same color between adjacent second pixel banks.

In the method for manufacturing the pixel structure of the present application, in the step S10, each of the pixel electrodes includes a main electrode shaped as a parallelogram and a connecting electrode and a bridge electrode disposed at two diagonal corners of the main electrode, and a bridge electrode is separated from the connecting electrode of another pixel electrode disposed in the same row, an interior angle of the main electrode is 45 degrees or 135 degrees.

In the method for manufacturing the pixel structure of the present application, in the step S20, the first pixel banks are arranged in gaps between the short sides of the main electrodes and cover the connecting electrodes and the bridge electrodes.

In the method for manufacturing the pixel structure of the present application, the second pixel banks are arranged in gaps between the long sides of the main electrodes and stride over parts of the first pixel bank._

The present application also provides a display panel, a pixel structure of the display panel includes: a substrate, a plurality of first pixel banks and a plurality of second pixel banks. The first pixel banks are disposed the substrate and intersect a long side direction of the substrate. The second pixel banks stride over the first pixel banks, are disposed on the substrate, and are parallel to the long side direction of the substrate. Light emitting materials of the same color are disposed between adjacent two of the second pixel banks, and the light emitting materials cover parts of the first pixel banks.

In the display panel of the present application, angles between the first pixel banks and the long side direction of the substrate are 45 degrees or 135 degrees In the display panel of the present application, a thickness of each of the second pixel banks is greater than a thickness of each of the first pixel banks.

In the display panel of the present application, the substrate includes driving circuits and a plurality of pixel electrodes disposed on the driving circuits, the pixel electrodes are connected to the driving circuits by a plurality of holes, and the holes are disposed under the first pixel banks.

In the display panel of the present application, each of the pixel electrode includes a main electrode disposed in a region limited by the first pixel banks and the second pixel banks and a connecting electrode and a bridge electrode electrically connected to the main electrode and disposed at two diagonal corners of the main electrode, and the connecting electrode are connected to the driving circuit by the hole.

In the display panel of the present application, the connecting electrode and the bridge electrode are disposed under the first pixel banks, and the bridge electrode is separated from the connecting electrode of another adjacent pixel electrode disposed in the same row.

In the display panel of the present application, a width of each of the connecting electrodes is less than a width of each of the main electrodes.

In the display panel of the present application, a width of each of the bridge electrodes is less than a width of each of the main electrodes.

The benefit of the present application is: the present application provides a pixel structure and its preparation method, wherein the long side direction of the pixel electrodes of the pixel structure is parallel to the long side direction of the substrate, so that the long side direction of the sub pixels printed by the light emitting materials is parallel to the long side direction of the substrate. In the case of a hybrid arrangement, there is no need to rotate the glass substrate 90°, and the OLED panels of two products can be printed directly. It does not increase the cost of equipment and time, and is suitable for mass production. It solves a problem of a limited printing method of a pixel arrangement of an OLED panel with the hybrid arrangement. The main electrodes of the pixel electrodes are set as parallelograms, the connecting electrode and the bridge electrode are disposed at the two diagonal corners of the main electrode, and when an adjacent sub-pixel of the same color is cut off by a problem of a short line or a short circuit occurring in the process, the bridge electrode can be connected to the adjacent sub-pixel of the same color by a laser welding process to achieve a repairing function. The connecting electrode is connected to the driving circuit through the holes, and all holes are distributed at an oblique 45 degrees, which does not affect the opening area and improves the pixel opening ratio.

BRIEF DESCRIPTION OF DRAWINGS

In order to more clearly explain the embodiments or the technical solutions in the prior art, the following will briefly introduce the drawings used in the description of the embodiments or the prior art. Obviously, the drawings in the following description are only inventions. Some embodiments, for those of ordinary skill in the art, on the premise of not paying creative labor, you can also obtain other drawings based on these drawings.

FIG. 12 is a flow chart of a method for manufacturing a pixel structure provided by one embodiment of the present application.

DETAILED DESCRIPTION OF PREFERRED EMBODIMENTS

Figure 1:
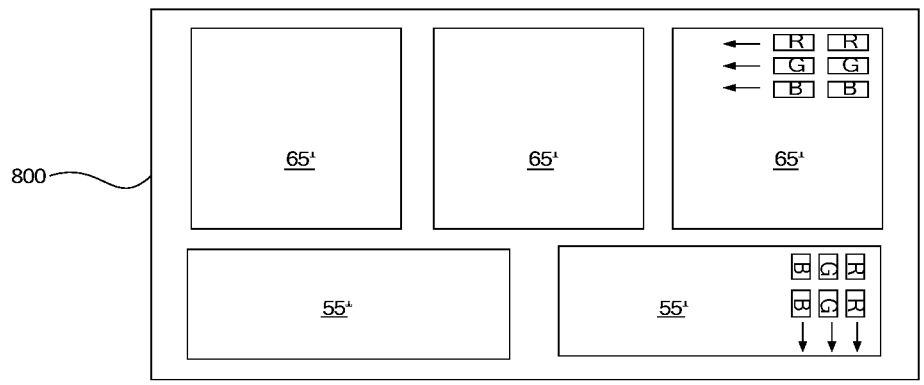
FIG. 1 is a schematic top view of a pixel arrangement of a hybrid array OLED panel in the prior art.

The following description of each embodiment refers to an additional illustration to illustrate specific embodiments that can be implemented in the present application. Directional terms mentioned in this application, such as "upper", "lower", "front", "back", "left", "right", "inner", "outer", "side", etc. are the direction of the schema. Therefore, the directional language used is to illustrate and understand this application, not to limit this application. In the figure, units with similar structures are indicated by the same reference numerals.

Figure 2:
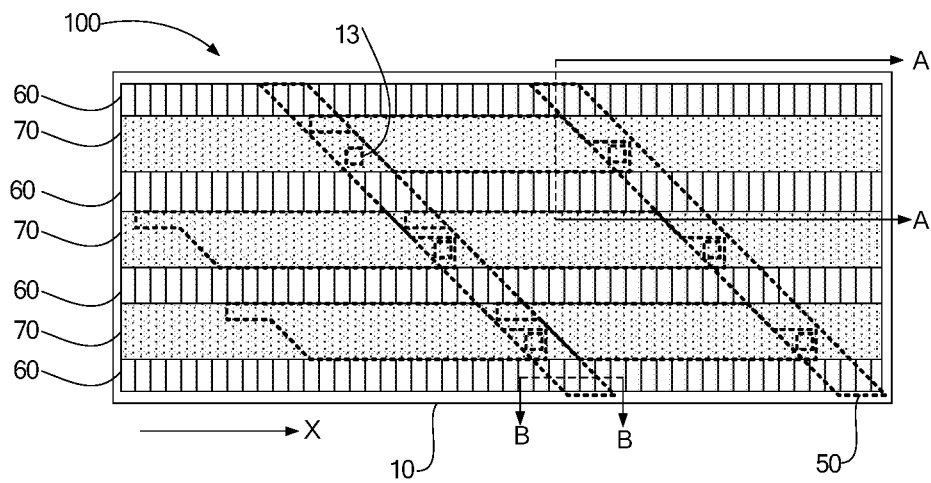
FIG. 2 is a schematic top view of a pixel structure provided by the embodiment of the present application.

In one embodiment, referring to FIG. 2, a pixel structure 100 is provided, and the pixel structure 100 includes a substrate 10, a plurality of first pixel banks 50, and a plurality of second pixel banks 60. The first pixel banks 50 are disposed on the substrate 10 and intersect a long side direction X of the substrate 10. The second pixel banks 60 stride over the first pixel banks 50, are disposed on the substrate 10, and are parallel to the long side direction X of the substrate 10. Light emitting materials 70 of a same color are disposed between two adjacent second pixel banks 60, and the light emitting materials 70 cover parts of the first pixel banks 50.

Specifically, the long side direction X of the substrate is defined as a direction parallel to a long side of the substrate.

Figure 3:
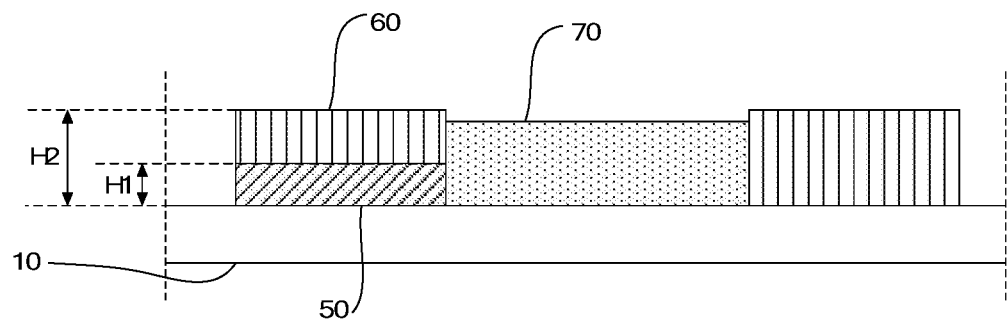
FIG. 3 is a schematic cross-sectional view in a direction A-A in FIG. 2.
Figure 4:
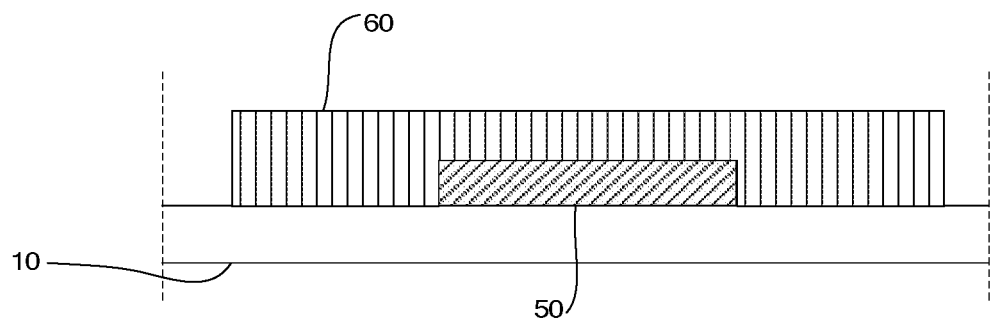
FIG. 4 is a schematic cross-sectional view in a direction B-B in FIG. 2.

Specifically, referring to FIG. 3, a thickness H2 of each of the second pixel banks 60 is greater than a thickness H1 of each of the first pixel banks 50, so that grooves are formed between the two adjacent second pixel banks 60. The light emitting materials 70 are printed in the grooves, and in a same groove, light emitting materials of the same color are printed. Portions of the first pixel banks 50 intersected with the second pixel banks 60 are covered by the second pixel banks 60, as shown in FIG. 4. Portions of the first pixel banks 50 not intersected with the second pixel banks 60 are disposed in the grooves and are covered by the light emitting materials 70.

In this embodiment, the light emitting materials are printed in entire strip grooves formed between the second pixel banks, so that long side directions of sub pixels are parallel to the long side direction of the substrate. In the case of a hybrid arrangement, there is no need to rotate the glass substrate 90°, and the OLED panels of two products can be printed directly. It does not increase the cost of equipment and time, and is suitable for mass production. It solves a problem of a limited printing method of a pixel arrangement of an OLED panel with the pixel hybrid arrangement.

Figure 5:
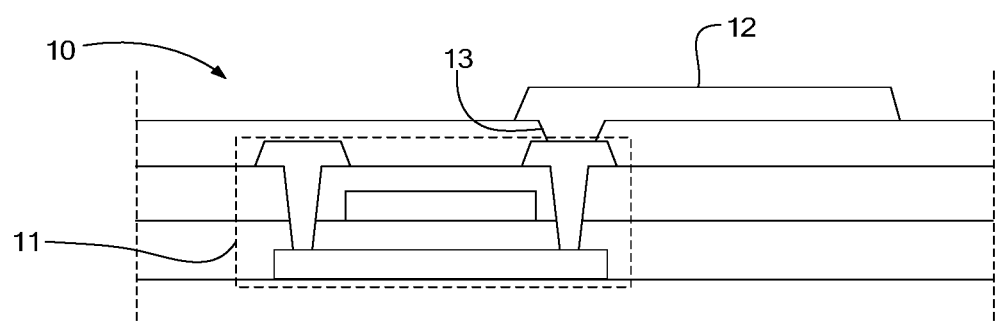
FIG. 5 is a schematic side view of a membrane structure of a substrate provided by one embodiment of the present application.

In one embodiment, referring to FIG. 5, the substrate 10 includes driving circuits 11 and a plurality of pixel electrodes 12 disposed on the driving circuits 11, and the pixel electrodes 12 are connected to the driving circuits 11 by a plurality of holes 13. As shown in FIG. 2, the holes 13 are positioned under the first pixel banks 50, and the holes 13 are covered by the pixel electrodes and the first pixel banks 50. Referring to an arrangement of the holes 13 in FIG. 6, FIG. 6 is a schematic diagram of the arrangement of the pixel electrodes 12, the first pixel banks and the second pixel banks are removed in FIG. 6 to clearly display the pixel electrodes 12 and the holes 13.

Figure 6:
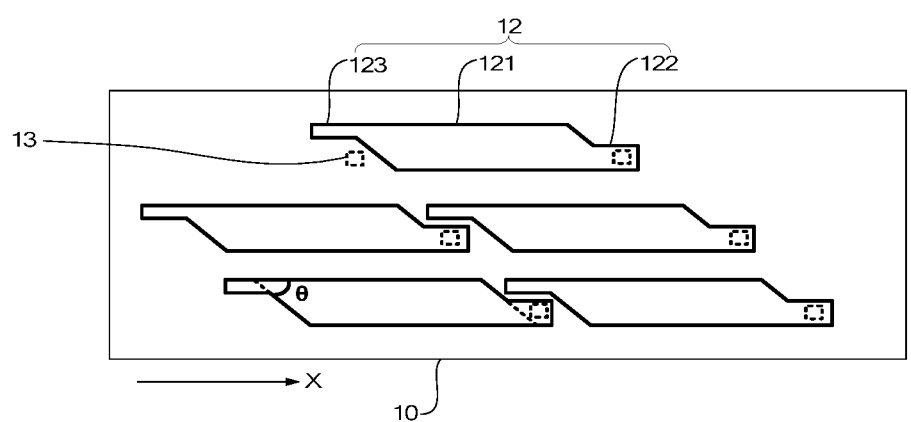
FIG. 6 is a schematic top view of a first arrangement of pixel electrodes disposed on the substrate according to one embodiment of the present application.

Specifically, referring to FIGS. 2, 5, and 6, the pixel electrodes 12 are separated from and parallel to each other, and the long side directions of the pixel electrodes 12 are parallel to the long side direction X of the substrate. Each of the pixel electrodes 12 includes a main electrode 121 disposed in a region limited by the first pixel banks 50 and the second pixel banks 60, and a connecting electrode 122 and a bridge electrode 123 electrically connected to the main electrode 121 and disposed at two diagonal corners of the main electrode 121.

Figure 7:
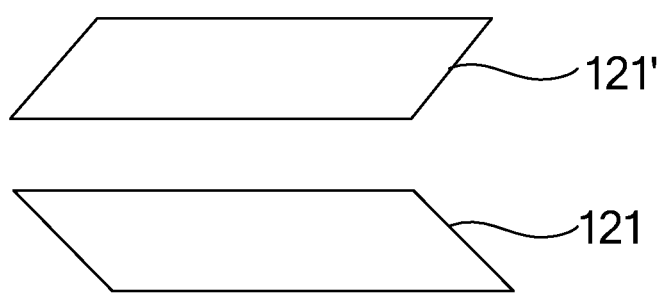
FIG. 7 is a schematic diagram comparing two main electrode structures provided by one embodiment of the present application

Specifically, a surface shape of the main electrode 121 is a parallelogram, the connecting electrode 122 and the bridge electrode 123 are disposed at the two diagonal corners of the parallelogram, specifically, which are disposed at the two diagonal corners θ with 45 degrees of the parallelogram, referring to FIG. 6. Of course, the parallelogram of the surface shape of the main electrode can be designed as a structure of a main electrode 121' of FIG. 7.

Further, referring to FIG. 6, the connecting electrodes 122 and the bridge electrodes 123 are disposed in the gaps between adjacent two of the main electrodes 121. Specifically, the connecting electrodes 122 are connected to the main electrodes 121 and the driving circuits by the holes 13. The holes 13 are disposed in the gaps defined between short sides of the main electrodes 121. A width of each of the connecting electrodes 122 is less than a width of each of the main electrodes 121, a length of the connecting electrode 122 is no more than a distance between the short sides of the main electrodes 121.

Further, a width of each of the bridge electrodes 123 is less than the width of each of the main electrodes 121, and a length of the bridge electrode 123 is no more than a distance between the short sides of the main electrodes 121. The bridge electrode 123 is separated from the connecting electrode 122 of another adjacent pixel electrode 12 disposed in the same row. The bridge electrode 123 is used to make the bridge electrode 123 and another adjacent pixel electrode 12 disposed in the same row be connected to a trace (not shown) of the hole 13 below the adjacent pixel electrode 12 through a laser welding process when a short line or a short circuit occur in a control circuit corresponding to the pixel electrode 12 (ie, a corresponding driving circuit), so that the pixel electrodes 12 corresponding to the bridge electrode 123 can be turned on and off simultaneously with the adjacent pixel electrodes 12 to prevent dark spots.

Figure 8:
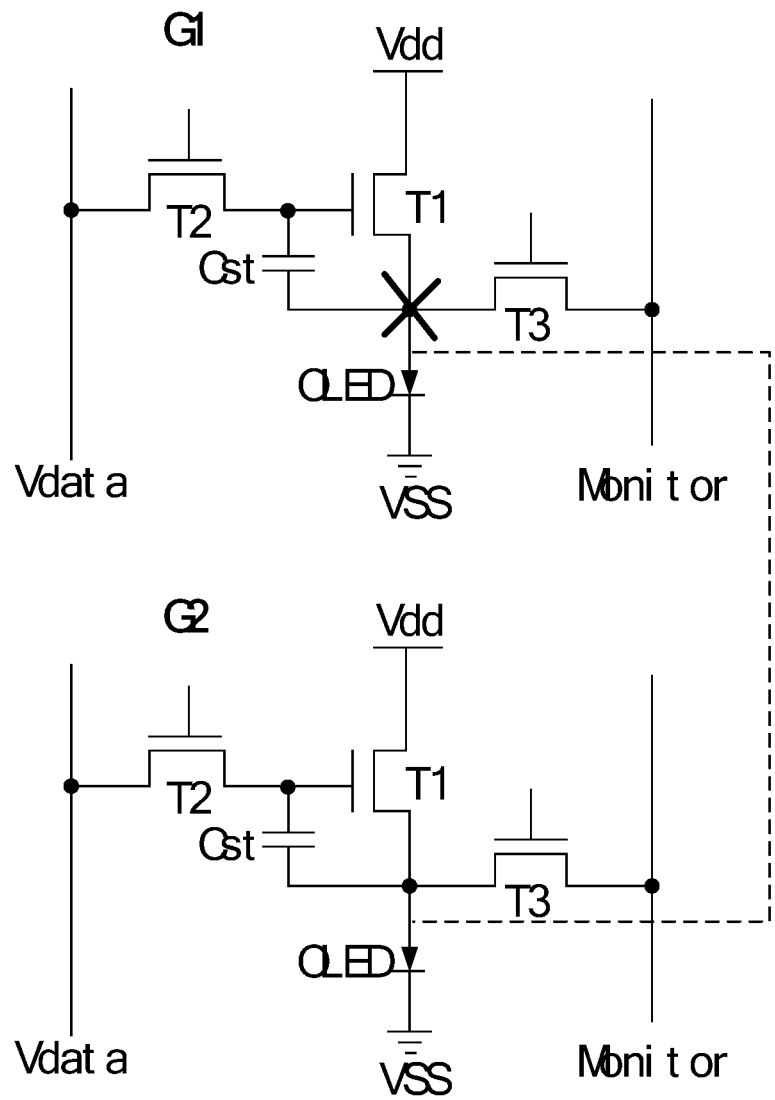
FIG. 8 is a repairing schematic diagram of the pixel electrodes provided by one embodiment of the present application.

Specifically, a welding principle of the bridge electrode is shown in FIG. 8, a conventional 3T1C (one sub-pixel includes 3 thin-film transistors and 1 storage capacitor) circuit is taken as an example, but the present application is not limited to this. Referring to FIG. 8, when an adjacent sub-pixel G1 of the same color is cut off by a problem of a short line or a short circuit occurring in the process (as shown in a cut-off position in FIG. 8), the sub-pixel G1 will not be lit. However, it can be connected to an adjacent sub-pixel G2 of the same color by a laser welding process or the like, a repair connection line is the dotted line as shown in FIG. 8.

Specifically, the connecting electrodes and the bridge electrodes are disposed under the first pixel banks, and the bridge electrodes are separated from adjacent connecting electrodes disposed in the same row.

Figure 9:
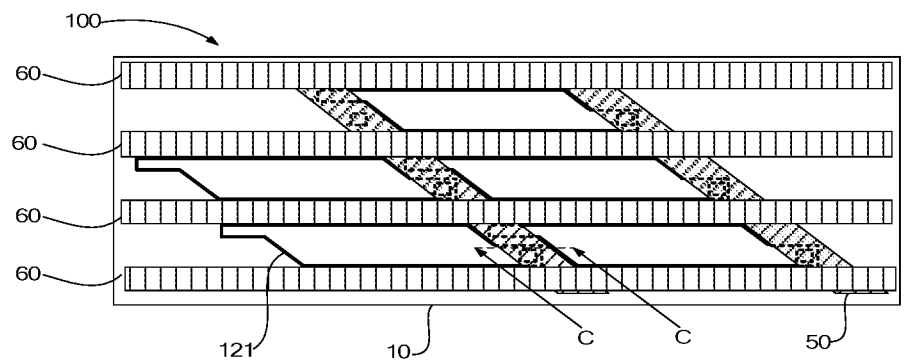
FIG. 9 is a schematic top view of the pixel electrodes and pixel banks provided by one embodiment of the present application.

Specifically, referring to FIG. 9, the first pixel banks 50 are entirely arranged in the gaps between the short sides of the main electrodes 121 and cover the connecting electrodes and the bridge electrodes. In order to clearly show the structures of the first pixel banks 50 and the like, the light emitting materials 70 covering them are removed in FIG. 9. Referring to FIGS. 6 and 9, since the internal angles between the connection sides of the main electrodes 121 and the connection electrodes 122 or the bridge electrodes 123 are 45 degrees, angles defined between the first pixel banks 50 and the long side direction of the substrate are 45 degrees or 135 degrees.

Figure 10:
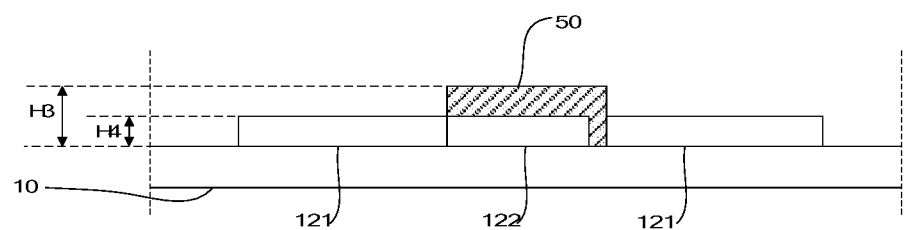
FIG. 10 is a schematic cross-sectional view in a direction C-C in FIG. 9.

Further, referring to FIG. 10, a thickness H3 of each of the first pixel banks 50 is greater than a thickness H4 of each of the pixel electrodes (only the main electrode 121 and the connecting electrode 122 of the pixel electrode are shown in FIG. 10).

Further, referring to FIG. 9, the second pixel banks 60 are entirely arranged in the gaps between the long sides of the main electrodes 121 and cover parts of the first pixel banks 50. The second pixel banks 60 are parallel to the long side direction of the substrate 10. The thickness of each of the second pixel banks 60 is greater than the thickness of each of the first pixel banks 50. The main electrodes 12 are disposed in regions limited by the first pixel banks 50 and the second pixel banks 60.

Further, grooves are formed between adjacent second pixel banks, and the light emitting materials are printed in the grooves. The light emitting materials of the same color are printed in the same groove, and the light emitting materials cover the first pixel banks.

In this embodiment, the long side directions of the pixel electrodes are parallel to the long side direction of the substrate, so that long side directions of the sub pixels printed by the light emitting materials are parallel to the long side direction of the substrate. It solves the problem that the printing method is limited by the pixel arrangement of the existing mixed-arrangement OLED panel. At the same time, the pixel electrodes with the parallelogram structures make the pixel electrodes opened at 45 degrees under the first pixel banks, which improves the pixel aperture ratio. The bridge electrodes are set to repair the corresponding sub-pixels.

Figure 11:
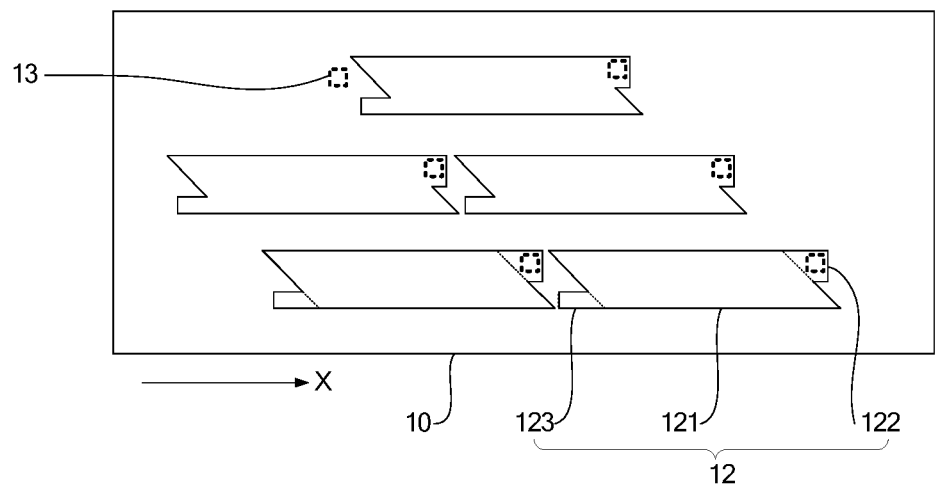
FIG. 11 is a schematic top view of a second arrangement of pixel electrodes disposed on the substrate according to one embodiment of the present application.

In another embodiment, differences from the above embodiments are: the connecting electrodes 122 and the bridge electrodes 123 of the pixel electrodes 12 are disposed at the diagonal corners θ' with 135 degrees of the parallelograms of the main electrodes 121, as shown in FIG. 11. For other descriptions, please refer to the above embodiments, which will not be repeated here.

In one embodiment, as shown in FIG. 12, a method for manufacturing a pixel structure is provided, which includes steps as following:

Step S10, manufacturing a substrate, which includes: providing a base plate, manufacturing driving circuits on the base plate, manufacturing a plurality of pixel electrodes on the driving circuits, wherein the pixel electrodes are connected to the driving circuits by a plurality of holes, long side directions of the pixel electrodes are parallel to a long side direction of the substrate.

Specifically, in the step S10, each of the pixel electrodes includes a main electrode shaped as a parallelogram and a connecting electrode and a bridge electrode disposed at two diagonal corners of the main electrode, and the bridge electrode is separated from the connecting electrode of another pixel electrode disposed in the same row, an interior angle of the main electrode is 45 degrees or 135 degrees.

Further, the connecting electrodes and the bridge electrodes are arranged in the gaps between the short sides of the main electrodes. Specifically, the connecting electrodes are connected to the main electrode and the driving circuit by the holes. The holes are arranged in the gaps between the short sides of the main electrodes. Widths of the connecting electrodes are less than widths of the main electrodes, and lengths of the connecting electrodes are no more than distances between the short sides of the main electrodes.

Further, a width of each of the bridge electrodes is less than the width of each of the main electrodes, a length of the bridge electrode is less than a distance between the short sides of the main electrode. The bridge electrode is separated from the connecting electrode of another adjacent pixel electrodes disposed in the same row. The bridge electrode is used to make the bridge electrode and another adjacent pixel electrode be connected through a laser welding process when a short line or a short circuit occur in a control circuit corresponding to the pixel electrode (ie, a corresponding driving circuit), so that the pixel electrodes corresponding to the bridge electrode can be turned on and off simultaneously with the adjacent pixel electrodes to prevent dark spots.

Step S20, manufacturing pixel banks, which includes: manufacturing a plurality of first pixel banks on the substrate, manufacturing a plurality of second pixel banks on the substrate, wherein the second pixel banks stride over the first pixel banks, a thickness of each of the second pixel banks is greater than a thickness of each of the first pixel banks.

Specifically, in the step S20, the first pixel banks are arranged in gaps between the short sides of the main electrodes and cover the connecting electrodes and the bridge electrodes. The second pixel banks are arranged in gaps between the long sides of the main electrodes.

Specifically, the first pixel banks are entirely arranged in the gaps between the short sides of the main electrodes and cover the connecting electrodes and the bridge electrodes. Since the internal angles of the connection sides of the main electrodes and the connection electrodes or the bridge electrodes are 45 degrees, angles defined between the first pixel banks and the long side of the substrate are 45 degrees or 135 degrees.

Further, a thickness of each of the first pixel banks is greater than a thickness of each of the pixel electrodes.

Further, the second pixel banks are entirely arranged in the gaps between the long sides of the main electrodes and stride over the first pixel bank. The second pixel banks are parallel to the long sides of the substrate. The thickness of each of the second pixel banks is greater than the thickness of each of the first pixel banks. The main electrodes are disposed in regions limited by the first pixel banks and the second pixel banks.

Step S30, manufacturing a light emitting layer, which includes: coating light emitting materials of the same color between adjacent second pixel banks.

Specifically, grooves are defined between adjacent two of the second pixel banks, the light emitting materials are printed in the grooves, and in the same groove, light emitting materials of the same color are printed, and the light emitting materials cover the first pixel banks.

In one embodiment, a display panel is provided, and the pixel structure includes a substrate, a plurality of first pixel banks, and a plurality of second pixel banks. The first pixel banks are disposed on the substrate and intersect a long side direction of the substrate. The second pixel banks stride over the first pixel banks are disposed on the substrate, and are parallel to the long side direction of the substrate. Light emitting materials of the same color are disposed between adjacent two of the second pixel banks, and the light emitting materials cover parts of the first pixel banks.

Specifically, angles defined between the first pixel banks and the long side direction of the substrate are 45 degrees or 135 degrees.

Specifically, a thickness of each of the second pixel banks is greater than a thickness of each of the first pixel banks.

Specifically, the substrate includes driving circuits and a plurality of pixel electrodes disposed on the driving circuits, the pixel electrodes are connected to the driving circuits by a plurality of holes, and the holes are disposed under the first pixel banks.

Further, each of the pixel electrode includes a main electrode disposed in a region limited by the first pixel banks and the second pixel banks and a connecting electrode and a bridge electrode electrically connected to the main electrode and disposed at two diagonal corners of the main electrode, and the connecting electrode are connected to the driving circuit by the hole.

Further, the connecting electrode and the bridge electrode are disposed under the first pixel bank, and the bridge electrode is separated from the connecting electrode of another adjacent pixel electrode disposed in the same row.

Further, a width of each of the connecting electrodes is less than a width of each of the main electrodes.

Further, a width of each of the bridge electrodes is less than the width of each of the main electrodes.

According to the above embodiments:

The present application provides a pixel structure and its preparation method, wherein the long side direction of the pixel electrodes of the pixel structure is parallel to the long side direction of the substrate, so that the long side direction of the sub pixels printed by the light emitting materials is parallel to the long side direction of the substrate. In the case of a hybrid arrangement, there is no need to rotate the glass substrate 90°, and the OLED panels of two products can be printed directly. It does not increase the cost of equipment and time, and is suitable for mass production. It solves a problem of a limited printing method of a pixel arrangement of an OLED panel with the hybrid arrangement. The main electrodes of the pixel electrodes are set as parallelograms, the connecting electrode and the bridge electrode are disposed at the two diagonal corners of the main electrode, and when an adjacent sub-pixel of the same color is cut off by a problem of a short line or a short circuit occurring in the process, the bridge electrode can be connected to the adjacent sub-pixel of the same color by a laser welding process to achieve a repairing function. The connecting electrode is connected to the driving circuit through the holes, and all holes are distributed at an oblique 45 degrees, which does not affect the opening area and improves the pixel opening ratio.

In summary, although the present application has been disclosed as preferred embodiments above, the above preferred embodiments are not intended to limit the present application. Those of ordinary skill in the art can make various changes without departing from the spirit and scope of the present application. such as changes and retouches. The scope of protection of this application shall be subject to the scope defined by the claims.

What is claimed is:

1. A pixel structure comprising:
   a substrate;
   a plurality of first pixel banks disposed on the substrate and intersecting a long side direction of the substrate in a plan view of the pixel structure; and
   a plurality of second pixel banks striding over the first pixel banks and disposed on the substrate, and parallel to the long side direction of the substrate in the plan view of the pixel structure;
   wherein light emitting materials of a same color extending along the long side direction are disposed between two adjacent ones of the second pixel banks in a wide side direction perpendicular to the long side direction, and the light emitting materials cover parts of the first pixel banks,
   wherein in the plan view of the pixel structure, angles between the first pixel banks and the long side direction of the substrate are 45 degrees or 135 degrees,
   wherein the substrate comprises driving circuits and a plurality of pixel electrodes respectively disposed on the driving circuits,
   wherein each of the pixel electrodes comprises a main electrode disposed in a region limited by the first pixel banks and the second pixel banks and a connecting electrode and a bridge electrode electrically connected to the main electrode and disposed at two diagonal corners of the main electrode, and in the plan view of the pixel structure, the connecting electrode and the bridge electrode respectively protrude outward along opposite directions in the long side direction from the two diagonal corners of the main electrode,
   wherein the connecting electrodes are connected to the driving circuits by a plurality of holes, and
   wherein under the condition that a short line or a short circuit occurs in at least one of the driving circuits, the bridge electrode comprised in at least one of the pixel electrodes corresponding to the at least one of the driving circuits is configured to be connected to another one of the pixel electrodes adjacent to the at least one pixel electrode in the long side direction, by being electrically connected to the connecting electrode, spaced apart from the bridge electrode in the wide side direction, of the another one of the pixel electrodes.

2. The pixel structure of claim 1, wherein a thickness of each of the second pixel banks is greater than a thickness of each of the first pixel banks.

3. The pixel structure of claim 1, wherein the holes are positioned under the first pixel banks.

4. The pixel structure of claim 3, wherein the connecting electrode and the bridge electrode are disposed under the first pixel banks, and at least one of the bridge electrodes is separated, in the wide side direction, from the connecting electrode of another adjacent one of the pixel electrodes disposed in a same row.

5. The pixel structure of claim 3, wherein a width of each of the connecting electrodes is less than a width of each of the main electrodes.

6. The pixel structure of claim 3, wherein a width of each of the bridge electrodes is less than a width of each of the main electrodes.

7. A display panel, wherein a pixel structure of the display panel comprises:
   a substrate;
   a plurality of first pixel banks disposed on the substrate and intersecting a long side direction of the substrate in a plan view of the pixel structure; and
   a plurality of second pixel banks striding over the first pixel banks and disposed on the substrate, and parallel to the long side direction of the substrate in the plan view of the pixel structure;
   wherein light emitting materials of a same color extending along the long side direction are disposed between two adjacent ones of the second pixel banks in a wide side direction perpendicular to the long side direction, and the light emitting materials cover parts of the first pixel banks,
   wherein in the plan view of the pixel structure, angles between the first pixel banks and the long side direction of the substrate are 45 degrees or 135 degrees,
   wherein the substrate comprises driving circuits and a plurality of pixel electrodes respectively disposed on the driving circuits,
   wherein each of the pixel electrodes comprises a main electrode disposed in a region limited by the first pixel banks and the second pixel banks and a connecting electrode and a bridge electrode electrically connected to the main electrode and disposed at two diagonal corners of the main electrode, and in the plan view of the pixel structure, the connecting electrode and the bridge electrode respectively protrude outward along opposite directions in the long side direction from the two diagonal corners of the main electrode,
   wherein the connecting electrodes are connected to the driving circuits by a plurality of holes, and
   wherein under the condition that a short line or a short circuit occurs in at least one of the driving circuits, the bridge electrode comprised in at least one of the pixel electrodes corresponding to the at least one of the driving circuits is configured to be connected to another one of the pixel electrodes adjacent to the at least one pixel electrode in the long side direction, by being electrically connected to the connecting electrode, spaced apart from the bridge electrode in the wide side direction, of the another one of the pixel electrodes.

8. The display panel of claim 7, wherein a thickness of each of the second pixel banks is greater than a thickness of each of the first pixel banks.

9. The display panel of claim 7, wherein the holes are positioned under the first pixel banks.

10. The display panel of claim 9, wherein the connecting electrode and the bridge electrode are disposed under the first pixel banks, and at least one of the bridge electrodes is separated, in the wide side direction, from the connecting electrode of another adjacent one of the pixel electrodes disposed in a same row.

11. The display panel of claim 9, wherein a width of each of the connecting electrodes is less than a width of each of the main electrodes.

12. The display panel of claim 9, wherein a width of each of the bridge electrodes is less than a width of each of the main electrodes.

\* \* \* \* \*